(12) United States Patent
Kuo et al.

(10) Patent No.: US 7,250,670 B2
(45) Date of Patent: Jul. 31, 2007

(54) SEMICONDUCTOR STRUCTURE AND FABRICATING METHOD THEREOF

(75) Inventors: Chien-Li Kuo, Hsinchu (TW); Bing-Chang Wu, Hsinchu County (TW); Jui-Meng Jao, Miaoli County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/162,863

(22) Filed: Sep. 27, 2005

(65) Prior Publication Data

US 2007/0069337 A1    Mar. 29, 2007

(51) Int. Cl.
*H01L 23/544* (2006.01)
(52) U.S. Cl. .............. 257/620; 257/644; 257/650; 257/762; 257/E23.194; 438/113; 438/114; 438/458; 438/462
(58) Field of Classification Search .............. 257/620
See application file for complete search history.

(56) References Cited

U.S. PATENT DOCUMENTS

| | | | | |
|---|---|---|---|---|
| 5,831,330 A | * | 11/1998 | Chang | 257/620 |
| 6,734,090 B2 | * | 5/2004 | Agarwala et al. | 438/598 |
| 6,841,455 B2 | * | 1/2005 | West et al. | 438/462 |
| 6,951,801 B2 | * | 10/2005 | Pozder et al. | 438/462 |
| 2004/0147097 A1 | * | 7/2004 | Pozder et al. | 438/584 |
| 2004/0164418 A1 | * | 8/2004 | Sugiura et al. | 257/758 |
| 2006/0022195 A1 | * | 2/2006 | Wang | 257/48 |

* cited by examiner

*Primary Examiner*—Minhloan Tran
*Assistant Examiner*—Eduardo A. Rodela
(74) *Attorney, Agent, or Firm*—Jianq Chyun IP Office

(57) ABSTRACT

A semiconductor structure is provided. The semiconductor structure is disposed on the scribe line of a wafer and is around the chip area of the wafer. The semiconductor structure includes a plurality of dielectric layers sequentially disposed on the scribe line and a plurality of metal patterns disposed in each dielectric layer. The metal patterns disposed in each dielectric layer extend to the next underlying dielectric layer.

19 Claims, 4 Drawing Sheets

SEMICONDUCTOR STRUCTURE AND FABRICATING METHOD THEREOF

BACKGROUND OF THE INVENTION

1. Field of Invention

The present invention relates to a semiconductor structure and a fabricating method thereof. More particularly, the present invention relates to a semiconductor structure and a fabricating method thereof, which prevents the chip from cracking.

2. Description of Related Art

The integrate circuit (IC) devices have almost been applied everywhere along with the quick developments of the semiconductor manufacture. However, the fabrication processes of integrate circuit devices are very complicated, basically including four main stages: integrate circuit design, wafer fabrication, wafer testing and wafer packaging. In general, about hundreds of different process steps are required for the fabrication of the IC devices and the whole procedure may need one or two months to complete.

In order to achieve mass production and cost reduction, the diameter of the wafer has been evolved to 12 inches from the early 4 inches or 5 inches. Accordingly, more clips can be made simultaneously on one wafer. In the process of fabricating integrate circuits, many patterns for inspection or testing are generally formed on the scribe lines of the wafer. The patterns include, for example, alignment marks, inspecting/measuring patterns, testing patterns for electrical properties and product codes, etc. However, during the packaging processes, the wafer will be sliced into chips through cutting the scribe lines of the wafer.

Usually, there are a plurality of parallel horizontal scribe lines and a plurality of parallel vertical scribe lines in one silicon wafer. After the devices on the wafer are completed, the wafer is sliced by scribing along the scribe line on the wafer using a diamond blade to obtain a plurality of chips. Since material layers of different materials are formed covering the wafer, the material layers disposed on the scribe line may be damaged or cracked when the wafer is scribed.

Particularly, the above damages are near the corners of the chip. That is, the damages at the crosses of the scribe lines are the most serious because the stress focuses on the crosses of the scribe lines. Moreover, even after packaging, the external influences, i.e., the temperature changes, may result in the extension of cracks or delamination. Usually, delamination is likely to occur in the interfaces of the low-k dielectric material layer and other layers. It is because the adhesion between the low-k dielectric material layer and other dielectric layers or metal layers is usually not good. Accordingly, the performance of the device may be degraded or the lifetime may be reduced, thus increasing the costs of packaging processes and lowering the reliability of devices.

SUMMARY OF THE INVENTION

Accordingly, the present invention is directed to provide a semiconductor structure, which can prevent the corners of the chips from cracking when the chip is scribed.

Another objective of the present invention is to provide a fabricating method of the semiconductor structure to prevent the corners of the chips from cracking by forming a metal pattern in the dielectric layer and surrounding the chip area of the wafer.

The present invention provides a semiconductor structure disposed on the scribe line of a wafer and around the chip area of the wafer. The semiconductor structure includes a plurality of dielectric layers subsequently disposed on the scribe line and a plurality of metal patterns disposed in each dielectric layer. Wherein, the metal pattern disposed in each dielectric layer extends to the underlying dielectric layer.

In the semiconductor structure according to the embodiment of the present invention, the metal pattern comprises a first part and a second part, and the second part is under the first part.

For the semiconductor structure according to the embodiment of the present invention, the width of the first part is the same as the width of the second part.

For the semiconductor structure according to the embodiment of the present invention, the width of the first part is greater than the width of the second part.

For the semiconductor structure according to the embodiment of the present invention, the metal patterns in each dielectric layer are arranged alternately to the metal patterns disposed in the next underlying dielectric layer.

For the semiconductor structure according to the embodiment of the present invention, the metal pattern disposed in each dielectric layer is connected to the metal pattern disposed on the next underlying dielectric layer.

In the semiconductor structure according to the embodiment of the present invention, the material of the metal pattern is, for example, copper.

In the semiconductor structure according to the embodiment of the present invention, the material of the dielectric layer is a low-k dielectric material, for example.

The present invention also provides a fabricating method of a semiconductor structure comprising providing a substrate; forming a first dielectric layer on the substrate; forming a second dielectric layer on the first dielectric layer; and forming a plurality of metal patterns in the second dielectric layer, wherein the metal patterns extend to the first dielectric layer.

In the fabricating method of semiconductor structure according to the embodiment of the present invention, the step of forming the metal patterns includes forming a plurality of trenches in the second dielectric layer; forming a plurality of openings in the second dielectric layer under the trenches, wherein the openings extend into the first dielectric layer; and filling a metal material in the trenches and the openings.

In the fabricating method of semiconductor structure according to the embodiment of the present invention, the step of forming the metal pattern includes forming a plurality of openings in the second dielectric layer; forming a plurality of trenches in the second dielectric layer above the openings; and filling a metal material in the trenches and the openings.

In the fabricating method of semiconductor structure according to the embodiment of the present invention, the material of the metal pattern is, for example, copper.

In the fabricating method of semiconductor structure according to the embodiment of the present invention, the material of the first dielectric layer is, for example, a low-k dielectric material.

In the fabricating method of semiconductor structure according to the embodiment of the present invention, the material of the second dielectric layer is, for example, a low-k dielectric material.

As a plurality of metal patterns is formed in each dielectric layer around the chips, when the chip is being scribed, the metal patterns can avoid the formation of cracks between the layers or especially at the corners of the chip. Therefore, the performance and reliability of the devices are improved. In addition, no extra step is required for the fabrication.

In order to the make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
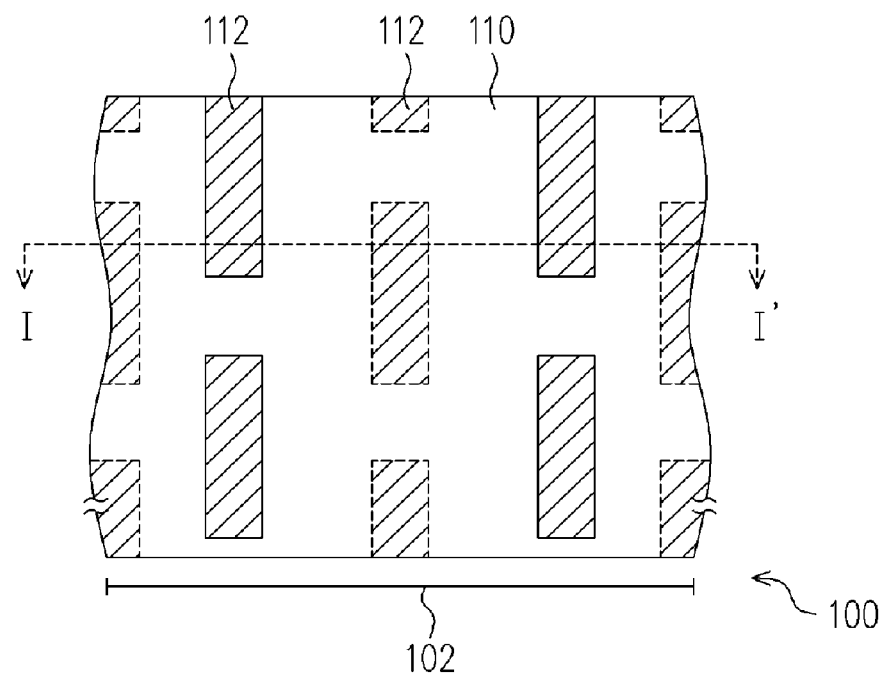
FIG. 1A is a top view of the semiconductor structure according to one embodiment of the present invention.
Figure 1B:
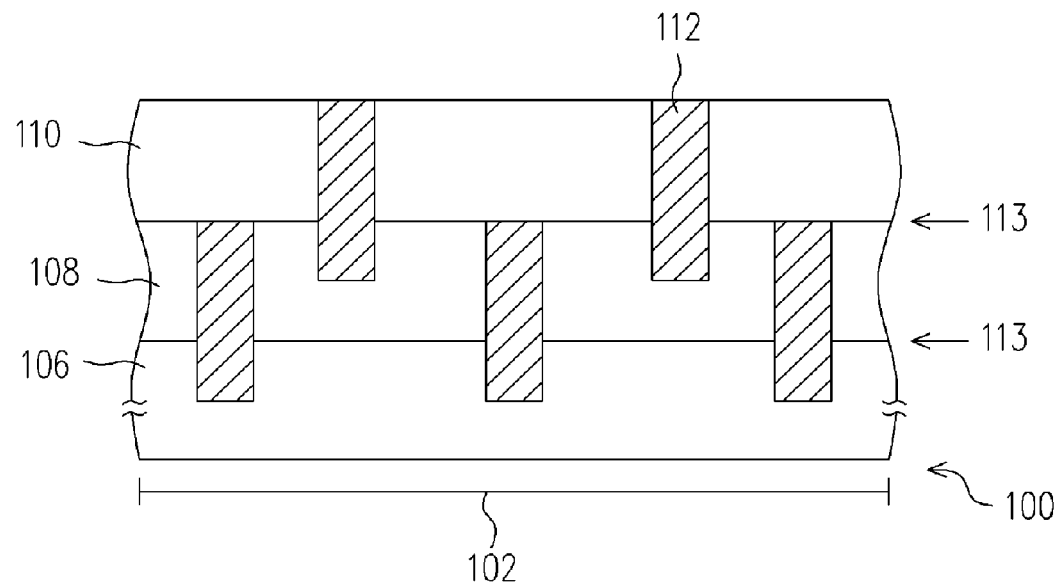
FIG. 1B is a cross-sectional view of a semiconductor structure along line I-I as shown in FIG. 1A.
Figure 1C:
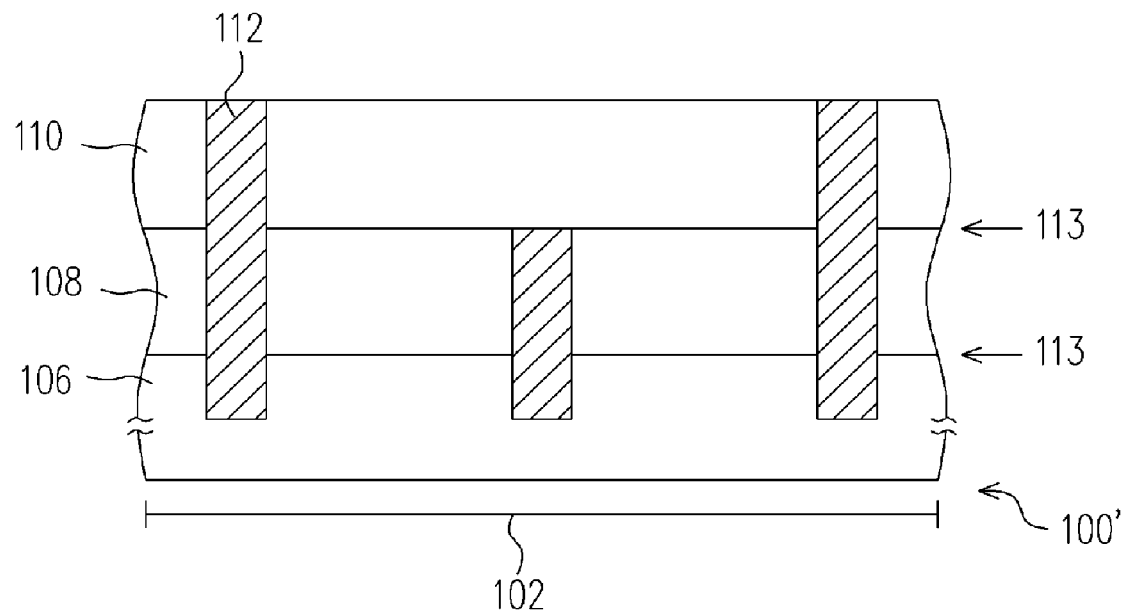
FIG. 1C is a schematic cross-sectional view of a semiconductor structure according to another embodiment of the present invention.
Figure 1D:
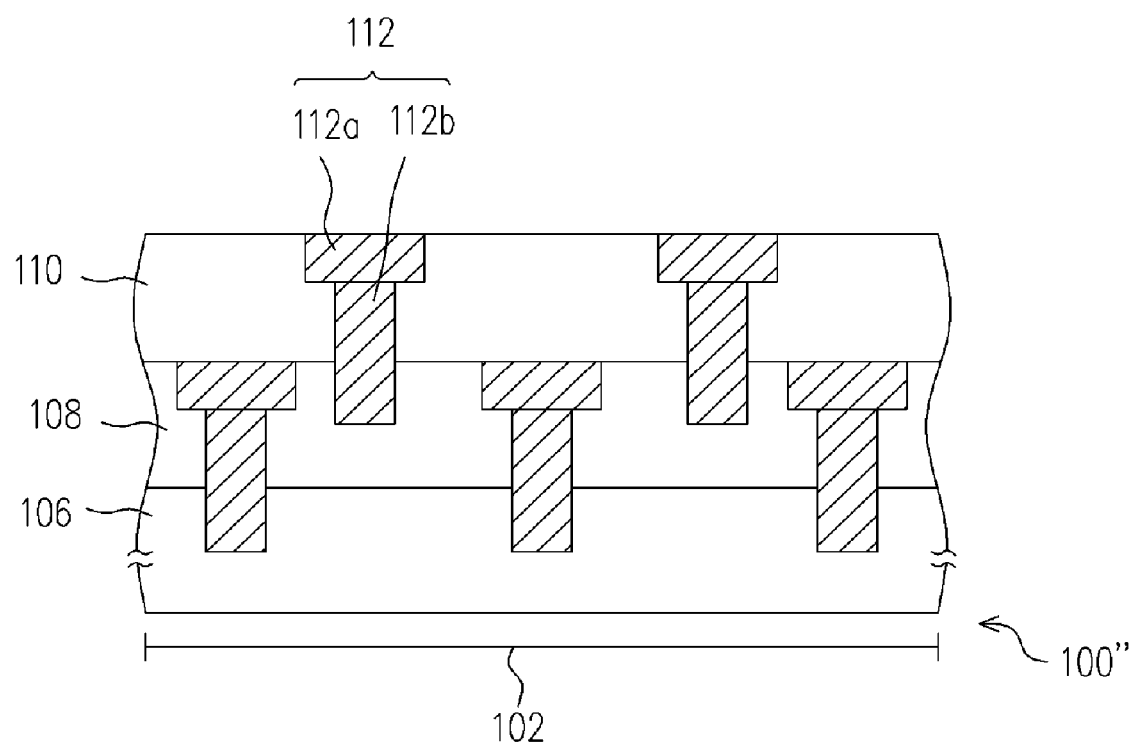
FIG. 1D is a schematic cross-sectional view of a semiconductor structure according to another embodiment of the present invention.
Figure 2:
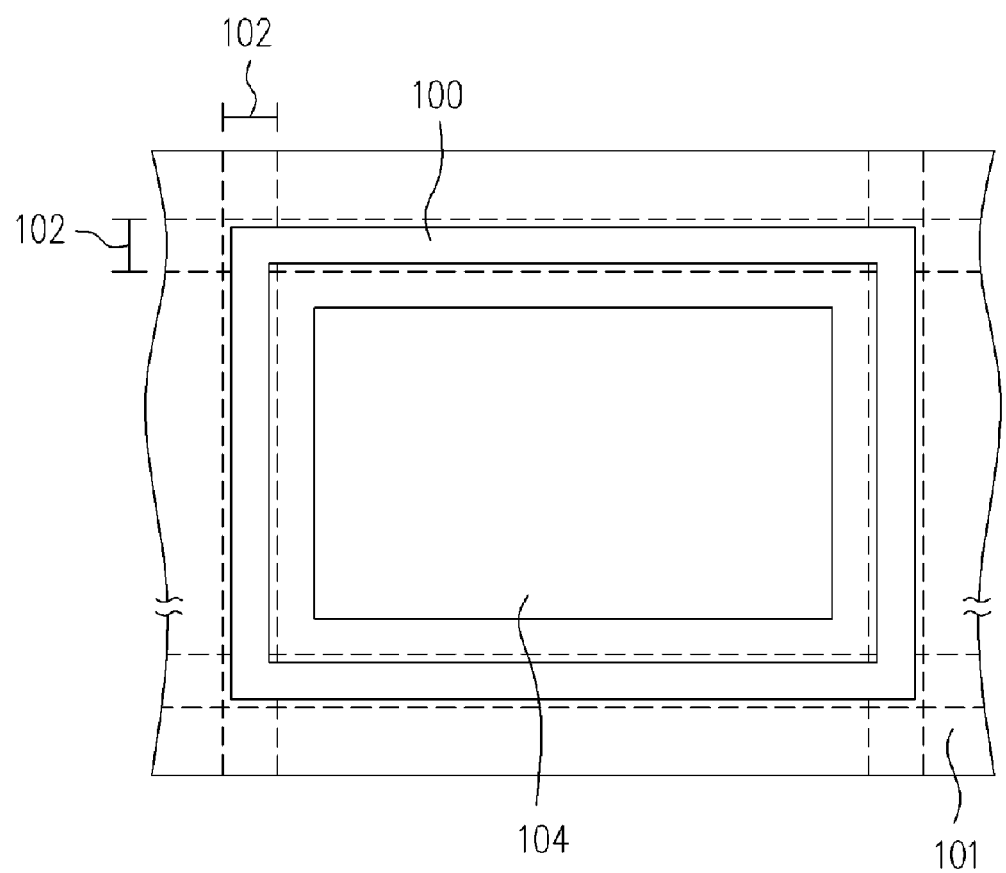
FIG. 2 is a top view of the semiconductor structure and the chip area according to the embodiment of the present invention.

FIG. 1A is a top view of the semiconductor structure according to one embodiment of the present invention. FIG. 1B is a cross-sectional view of a semiconductor structure along line I-I as shown in FIG. 1A. FIG. 1C is a schematic cross-sectional view of a semiconductor structure according to another embodiment of the present invention. FIG. 1D is a schematic cross-sectional view of a semiconductor structure according to another embodiment of the present invention. FIG. 2 is a top view of the semiconductor structure and the chip area according to the embodiment of the present invention.

Referring to FIG. 1A, FIG. 1B and FIG. 2 simultaneously, the semiconductor structure 100 is disposed on the scribe lines 102 of a wafer 101 and surrounding the chip area 104 of the wafer 101, wherein the chip area 104 has, for example, a MOS transistor, other semiconductor devices or circuits. The semiconductor structure 100 includes dielectric layers 106, 108, 110 and metal patterns 112. The dielectric layers 106, 108 and 110 are sequentially disposed on the scribe line 102, wherein the material of the dielectric layer 106, 108 and 110 includes a low-k dielectric material. The low-k dielectric material is fluorosilicate glass, for example. The material of the metal pattern 112 is, for example, copper. The metal patterns 112 disposed in each dielectric layer extend into a portion of the underlying dielectric layer. For example, the metal pattern 112 disposed in the dielectric layer 110 extends into a portion of dielectric layer 108 under the dielectric layer 110, and the metal pattern 112 disposed in the dielectric layer 108 extends into a portion of dielectric layer 106 under the dielectric layer 108. One possible function of extending the metal pattern 112 downward to a portion of the underlying dielectric layer is to mitigate the cracking or delamination phenomena in the interface 113 between each dielectric layers. Moreover, the metal pattern 112 disposed in each dielectric layer can prevent the cracks from extending into the chip area 104 to cause the damages of the chips. In the present invention, the metal patterns 112 disposed in two adjacent dielectric layers are arranged in an alternate way, for example. That is, the metal patterns 112 disposed in the dielectric layer 110 are arranged alternately to the metal patterns 112 disposed in the dielectric layer 108.

Moreover, in another embodiment as shown in FIG. 1C, when the metal pattern 112 disposed in the semiconductor structure 100' extends into the underlying dielectric layer 108, the metal pattern 112 disposed in the dielectric layer 110 can be connected to the metal pattern 112 disposed on the next underlying dielectric layer 108, so that the metal patterns 112 extend directly into a portion of the dielectric layer 106 from the dielectric layer 110. In addition, in also another embodiment as shown in FIG. 1D, the metal pattern 112 disposed in the semiconductor structure 100" can comprise a metal 112a and a metal 112b, wherein the metal 112a is disposed above the metal 112b, and the width of the metal 112a is greater than the width of the metal 112b, wherein the material of the metal 112a and the metal 112b is, for example, copper.

Figure 3A:
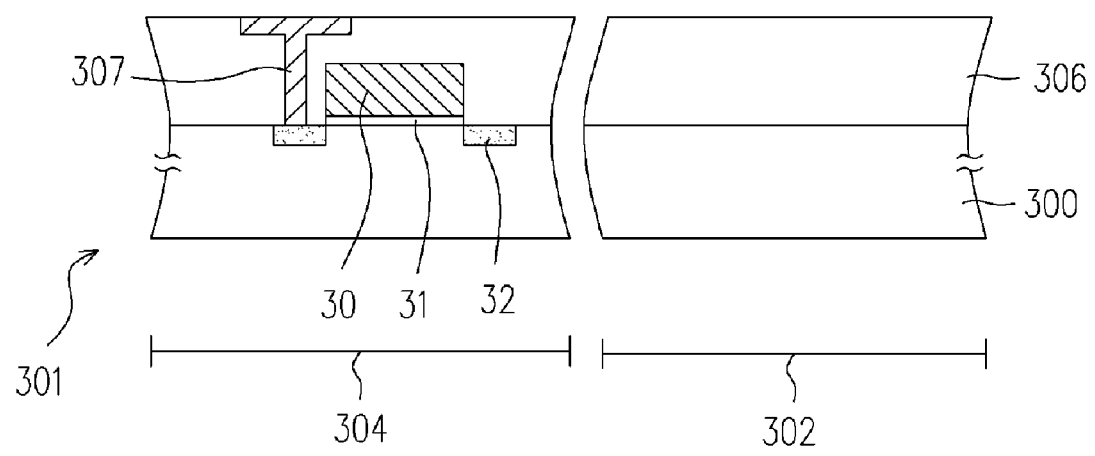
FIG. 3A to FIG. 3C are cross-sectional views of the fabricating processes of the dielectric structure according to the embodiment of the present invention.
Figure 3B:
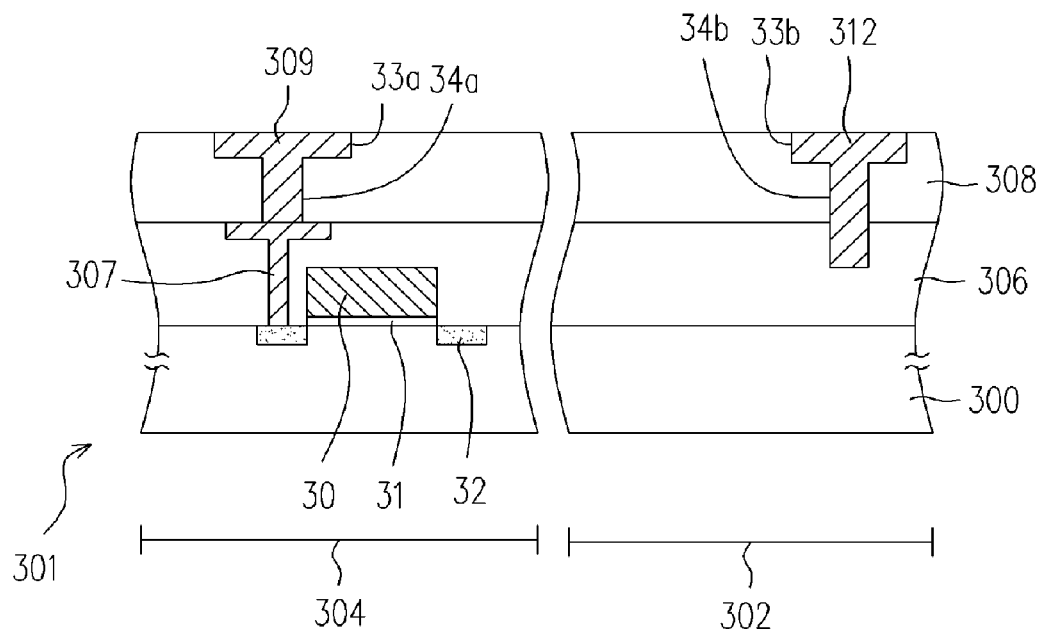
Figure 3C:
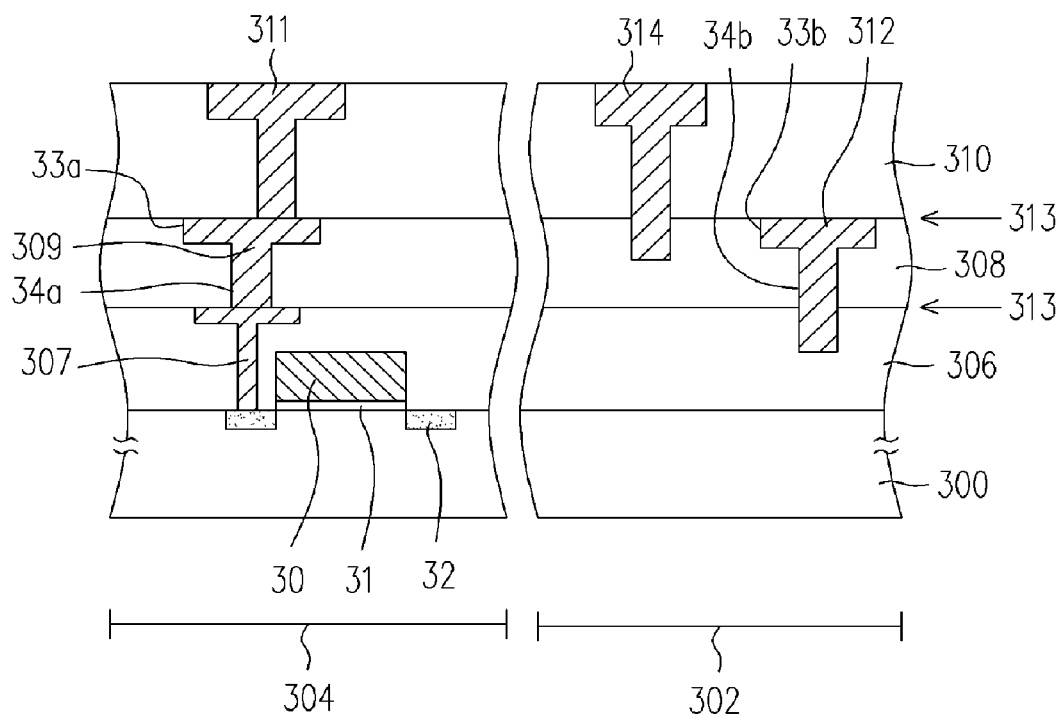

FIG. 3A to FIG. 3C are cross-sectional views of the fabricating processes of the dielectric structure according to the embodiment of the present invention. First, referring to FIG. 3A, the wafer 301 has a scribe line area 302 and a chip area 304. A MOS transistor is formed on the substrate 300 of the chip area 304, wherein the MOS transistor comprises a gate 30, a gate dielectric layer 31 and a source/drain region 32. Next, a dielectric layer 306 is formed on the substrate 300, wherein the material of the dielectric layer 306 is, for example, a low-k dielectric material. The low-k dielectric material is fluorosilicate glass, for example. Thereafter, a metal interconnection structure, for example, a dual damascene structure 307, in the dielectric layer 306. The dual damascene structure 307 is electrically connected to the source/drain region 32, wherein the material of the dual damascene structure 307 is, for example, copper.

Next, referring to FIG. 3B, a dielectric layer 308 is formed on the dielectric layer 306, wherein the material of the dielectric layer 308 is, for example, a low-k dielectric material. The low-k dielectric material is fluorosilicate glass, for example. Next, a dual damascene structure 309 and a metal pattern 312 are formed in the dielectric layer 308, wherein the material of the metal pattern 312 is, for example, copper. It is noted that the metal pattern 312 and the dual damascene structure 309 are formed simultaneously in the same fabricating step, by, for example, performing the first etching process to form the trenches 33a and 33b in the dielectric layer 308; performing the second etching process to form the openings 34a and 34b in the dielectric layer 308 disposed under the trenches 33a, 33b. During the second etching process, for the dielectric layer 308 disposed under the trench 33a etching will stop at the dual damascene structure 307, and the dielectric layer 308 disposed under the trench 33b will be continuously etched downward to a depth of the dielectric layer 306. The depth is, for example, between 200 Å to 3000 Å, and preferably is 1500 Å. Next, a metal material layer (not shown) is formed on the substrate to fill the trenches 33a, 33b and the openings 34a, 34b. Then, the dual damascene structure 309 and the metal pattern 312 are formed by performing a planarizing process using chemical mechanic abrasion process.

In addition, in another embodiment, a first etching process is performed to the dielectric layer 308 to form the openings 34a, 34b. Next, the trenches 33a, 33b are formed in a part of the dielectric layer 308 above the openings 34a, 34b. Next, the metal patterns 312 and the dual damascene structure 309 are formed in the trenches 33a, 33b and the openings 34a, 34b.

Then, please refer to FIG. 3C, the dielectric layer 310 is formed on the dielectric layer 308, wherein the material of the dielectric layer 310 is a low-k dielectric material, for example. The low-k dielectric material is, for example, fluorosilicate glass. Next, the dual damascene structure 311 and the metal pattern 314 on the dielectric layer 310 are formed by the same way. It is noted that the metal patterns 314 are arranged alternately to the metal patterns 312 disposed under the metal pattern 314. Therefore, the metal patterns 312, 314 can prevent cracks or delamination in the interface 313 between each dielectric layer.

It is noted that the embodiments of the present invention is described by using the semiconductor structure with three dielectric layers as an example. However, the present invention is not limited by these embodiments, and users can apply the dielectric layer with four layers, five layers or even more layers according to the film layers formed in the chip area.

When the chip is scribed, the stress may result in cracking at the corners of the chip. The semiconductor structure of the present invention is formed on the scribe lines around the chip or surrounding the chip area, and the metal patterns in the semiconductor structure can prevent cracks from continuously extending to the chip area. Moreover, the semiconductor structure of the present invention is concurrently fabricated along with the semiconductor devices in the chip area, so that no extra fabricating process is required.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor structure, including:
   a wafer having a chip area and a scribe line around the chip area;
   a first dielectric layer and a second dielectric layer, sequentially disposed on the scribe line, wherein the first and second dielectric layers have a first interface therebetween; and
   a first metal pattern, disposed passing through the second dielectric layer, the first interface and a portion of the first dielectric layer but not passing through the whole first dielectric layer,
   wherein the first metal pattern has a first part and a second part, the second part is under the first part, and a width of the first part is the same to or greater than that of the second part.

2. The semiconductor structure as claimed in claim 1, wherein a material of the first metal pattern is copper.

3. The semiconductor structure as claimed in claim 1, wherein a material of the first and second dielectric layers is a low-k dielectric material.

4. The semiconductor structure as claimed in claim 3, wherein the low-k dielectric material is fluorosilicate glass (FSG).

5. The semiconductor structure as claimed in claim 1, further comprising:
   a third dielectric layer disposed on the second dielectric layer, wherein the second and third dielectric layers have a second interface therebetween; and
   a second metal pattern, disposed passing through third dielectric layer, the second interface, the second dielectric layer, the first interface and a portion of the first dielectric layer but not passing through the whole first dielectric layer.

6. A fabrication method of semiconductor structure, including
   providing a wafer having a chip area and a scribe line around the chip area;
   forming a first dielectric layer on the wafer;
   forming a second dielectric layer on the first dielectric layer, wherein the first and second dielectric layer has a first interface therebetween; and
   forming a first metal pattern passing through the second dielectric layer, the first interface and a portion of the first dielectric layer but not passing through the whole first dielectric layer,
   wherein the step of forming the first metal pattern includes;
   forming a trench in the second dielectric layer;
   forming an opening in the second dielectric layer under the trench, wherein the opening extends into a portion of the first dielectric layer; and filling a metal material in the trench and opening.

7. The fabrication method of semiconductor structure as claimed in claim 6, wherein a material of the first metal pattern is copper.

8. The fabrication method of semiconductor structure as claimed in claim 6, wherein a material of the first dielectric layer is a low-k dielectric material.

9. The fabrication method of semiconductor structure as claimed in claim 8, wherein the low-k dielectric material is fluorosilicate glass (FSG).

10. The fabrication method of semiconductor structure as claimed in claim 6, wherein a material of the second dielectric layer is a low-k dielectric material.

11. The fabrication method of semiconductor structure as claimed in claim 10, wherein the low-k dielectric material is fluorosilicate glass (FSG).

12. The fabrication method of semiconductor structure as claimed in claim 6, further comprising:
    forming a third dielectric layer on the second dielectric layer, wherein the second and third dielectric layers have a second interface therebetween; and
    forming a second metal pattern passing through third dielectric layer, the second interface, the second dielectric layer, the first interface and a portion of die first dielectric layer but not passing through the whole first dielectric layer.

13. A fabrication method of semiconductor structure, including
    providing a wafer having a chip area and a scribe line around the chip area;
    forming a first dielectric layer on the wafer;
    forming a second dielectric layer on the first dielectric layer, wherein the first and second dielectric layer has a first interface therebetween; and forming a first metal pattern passing through the second dielectric layer, the first interface and a portion of the first dielectric layer but not passing through the whole first dielectric layer, wherein the step of forming the first metal pattern includes:

forming an opening in the second dielectric layer, and the opening extends into a portion of the first dielectric layer;

forming a trench in the second dielectric layer above the opening; and filling a metal material in the trench and opening.

14. The fabrication method of semiconductor structure as claimed in claim 13, wherein a material of the first metal pattern is copper.

15. The fabrication method of semiconductor structure as claimed in claim 13, wherein a material of the first dielectric layer is a low-k dielectric material.

16. The fabrication method of semiconductor structure as claimed in claim 15, wherein the low-k dielectric material is fluorosilicate glass (FSG).

17. The fabrication method of semiconductor structure as claimed in claim 13, wherein a material of the second dielectric layer is a low-k dielectric material.

18. The fabrication method of semiconductor structure as claimed in claim 17, wherein the low-k dielectric material is fluorosilicate glass (FSG).

19. The fabrication method of semiconductor structure as claimed in claim 13, comprising:

forming a third dielectric layer on the second dielectric layer, wherein the second and third dielectric layers have a second interface therebetween; and forming a second metal pattern passing through third dielectric layer, the second interface, the second dielectric layer, the first interface and a portion of the first dielectric layer but not passing through the whole first dielectric layer.

* * * * *